United States Patent
Balasubramanian

(10) Patent No.: US 9,335,784 B2
(45) Date of Patent: May 10, 2016

(54) CLOCK DISTRIBUTION CIRCUIT WITH DISTRIBUTED DELAY LOCKED LOOP

(71) Applicant: Cavium, Inc., San Jose, CA (US)

(72) Inventor: Suresh Balasubramanian, Shrewsbury, MA (US)

(73) Assignee: Cavium, Inc., San Jose, CA (US)

( * ) Notice: Subject to any disclaimer, the term of this patent is extended or adjusted under 35 U.S.C. 154(b) by 274 days.

(21) Appl. No.: 14/015,607

(22) Filed: Aug. 30, 2013

(65) Prior Publication Data

US 2015/0067383 A1    Mar. 5, 2015

(51) Int. Cl.
*G06F 1/00* (2006.01)
*G06F 1/10* (2006.01)
*H03L 7/081* (2006.01)

(52) U.S. Cl.
CPC ............... *G06F 1/10* (2013.01); *H03L 7/0812* (2013.01)

(58) Field of Classification Search
CPC ........................................................ G06F 1/10
USPC ........................................................ 713/500
See application file for complete search history.

(56) References Cited

U.S. PATENT DOCUMENTS

| | | | | |
|---|---|---|---|---|
| 6,150,866 A * | 11/2000 | Eto et al. | | 327/297 |
| 6,418,537 B1 * | 7/2002 | Yang | G06F 12/0813 | 710/60 |
| 7,620,839 B2 * | 11/2009 | Chen | G06F 1/12 | 713/500 |
| 8,513,994 B2 | 8/2013 | Balasubramanian | | |
| 2003/0052343 A1 * | 3/2003 | Magoshi | | 257/233 |
| 2003/0071669 A1 * | 4/2003 | Liu et al. | | 327/158 |
| 2009/0184741 A1 * | 7/2009 | Suda et al. | | 327/158 |
| 2011/0239031 A1 * | 9/2011 | Ware | G11C 7/04 | 713/500 |
| 2012/0206181 A1 * | 8/2012 | Lin | H03K 5/135 | 327/199 |
| 2014/0040652 A1 * | 2/2014 | Kulick | | 713/400 |

* cited by examiner

*Primary Examiner* — Mohammed Rehman
(74) *Attorney, Agent, or Firm* — Hamilton, Brook, Smith & Reynolds, P.C.

(57) ABSTRACT

In an embodiment, a clock distribution circuit includes a global delay locked loop (DLL) configured to receive a global clock input signal (RCLK), a lead/lag input signal and to output a clock signal. The circuit includes a plurality of clock distribution blocks, each clock distribution block configured to receive the output of the global DLL, a lead/lag signal and to output a leaf node clock signal, each clock distribution block further comprises a local DLL. The global DLL is further configured to align one of the leaf node clock signals to a reference clock based on its lead/lag input signal. Each clock distribution block is further configured to align its leaf node clock signal to a reference clock based on its lead/lag signal.

8 Claims, 5 Drawing Sheets

CLOCK DISTRIBUTION CIRCUIT WITH DISTRIBUTED DELAY LOCKED LOOP

BACKGROUND

Integrated circuits (ICs) typically contain large numbers of elements that are synchronized to a system clock. Different clock distribution methods can be used to distribute the system clock to these elements. However, as the clock signal propagates through the clock distribution structure, issues such as process, voltage and temperature (PVT) variations can impact the delay of the clock signal. In order to ensure proper synchronous behavior, the distributed clock signals may need to be aligned to the system clock. Delay locked loops (DLLs) are typically used to align the distributed clock signals to a reference clock that is running at the same frequency or an integer sub-multiple of the system clock frequency.

SUMMARY

Embodiments of the present invention provide a clock distribution network with multiple branches, each terminating in a leaf node. A clock distribution circuit includes a global delay locked loop (DLL) configured to receive a global clock input signal, a lead/lag input signal and to output a clock signal. The circuit includes a plurality of clock distribution blocks, each clock distribution block configured to receive the output of the global DLL, a lead/lag signal and to output a leaf node clock signal, each clock distribution block further comprises a local DLL. The global DLL is further configured to align one of the leaf node clock signals to a reference clock based on its lead/lag input signal. Each clock distribution block is further configured to align its leaf node clock signal to a reference clock based on its lead/lag signal. The global DLL is locked once it aligns one of the leaf node clock signals to the reference clock.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

A typical global clock distribution network includes multiple branches that terminate in leaf nodes that provide localized clock signals. Each leaf node is required to be phase aligned to an input reference clock that is running at the same frequency or an integer sub-multiple of the system clock frequency.

As the global clock is distributed along the network, phenomena such as process, voltage and temperature (PVT) variations can degrade the global clock as it is propagated along the clock network. The end result is that the localized clocks at the leaf nodes may not be phase aligned to the system clock.

Figure 1:
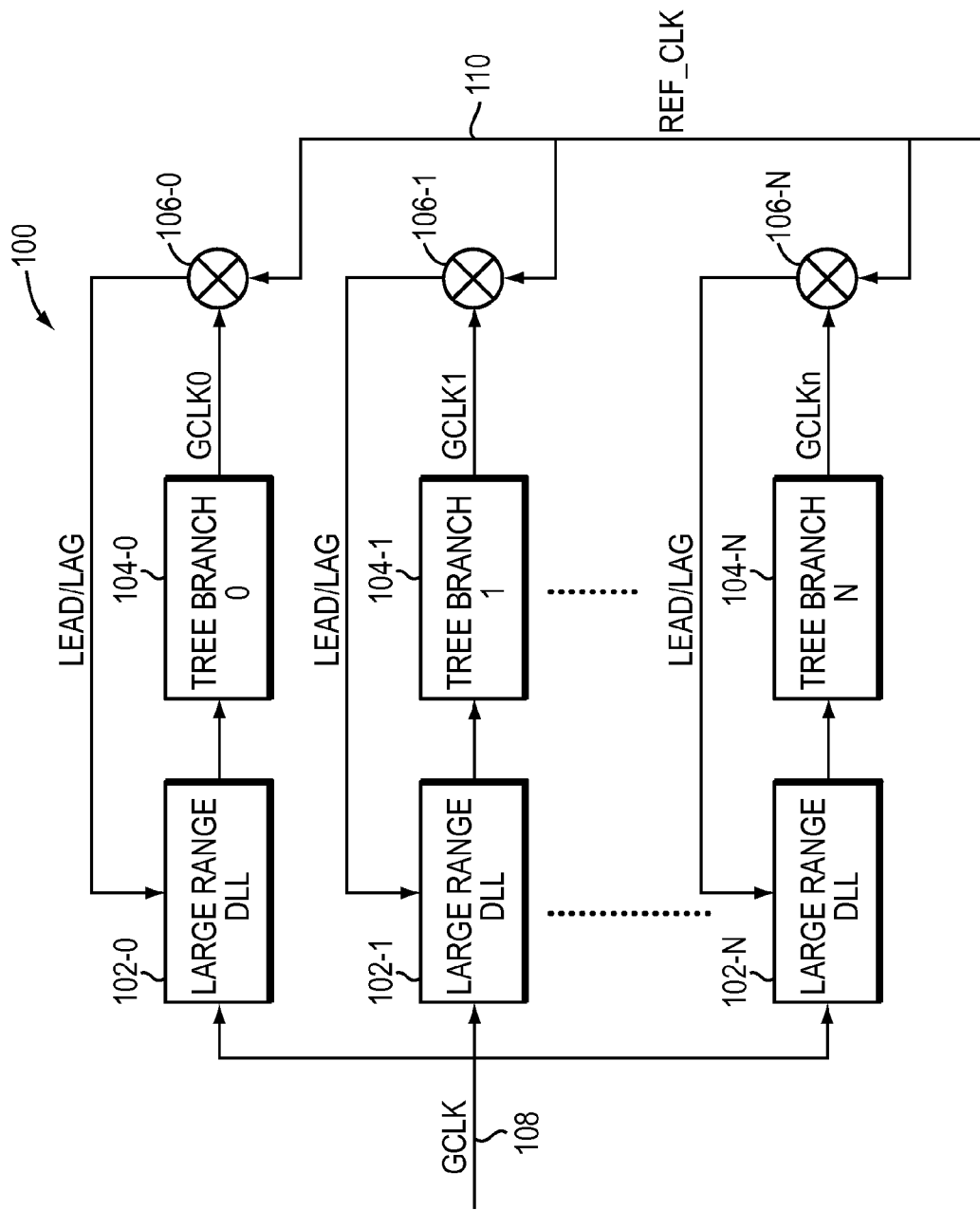
FIG. 1 is a block diagram showing a typical implementation for clock distribution and alignment.

A typical implementation of a clock distribution network 100 is shown in FIG. 1. A large range delay locked loop (DLL) (102-0, 102-1, ..., 102-n) is inserted into each branch (104-0, 104-1, ..., 104-n) of the global clock distribution network. The clock signal (GCLK0 ... GCLKn) generated at the leaf node of each branch is independently aligned to a reference clock (REF_CLK) 110. The large range DLL on each clock branch must be able to align the clock generated at a leaf node (GCLKn) with REF_CLK under worst case PVT variations. Additionally, each large range DLL must be able to handle at a minimum, a timing delay mismatch between the clock signal at a leaf node (GCLKn) and REF_CLK, of at least one phase of the system or global clock (GCLK) 108.

Figure 2:
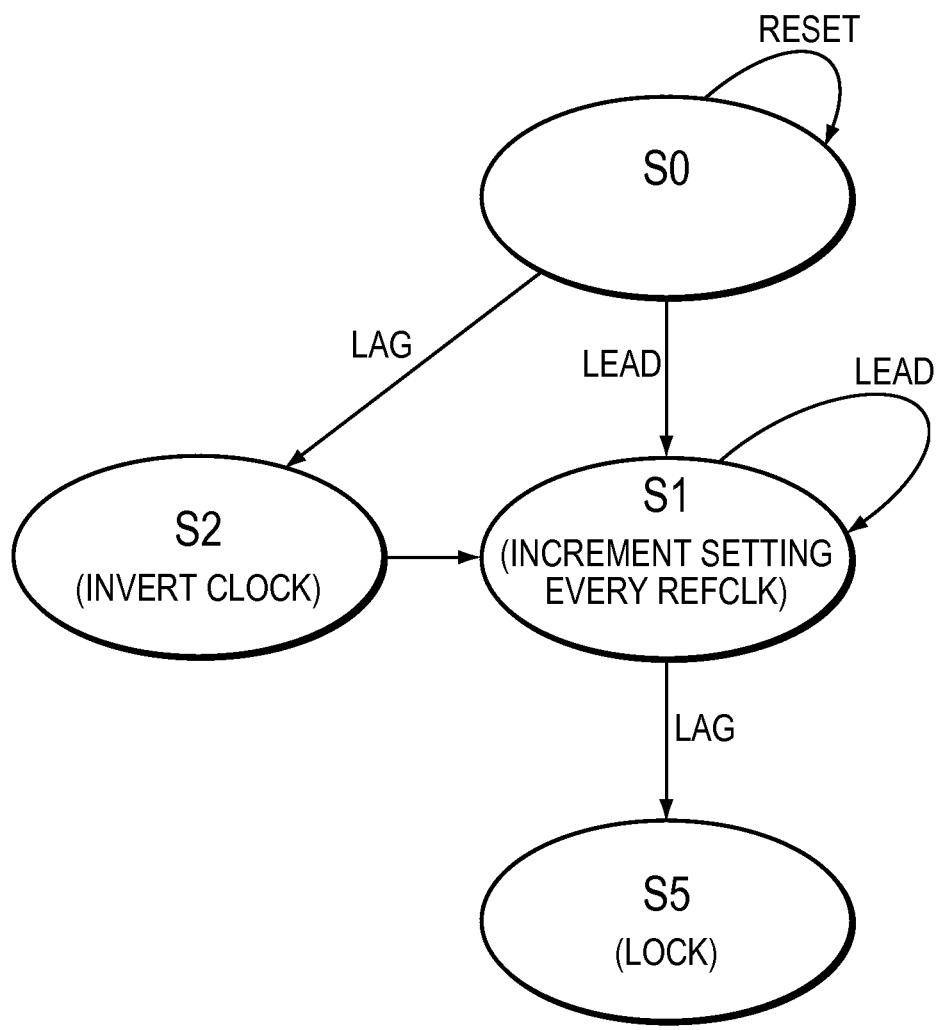
FIG. 2 is a diagram showing a finite state machine for a large range delay locked loop (DLL).

A finite state machine (FSM) for a large range DLL in a typical clock distribution network is shown in FIG. 2. The DLL is initialized to state S0. While in S0, the DLL can transition states based on input signals "reset", "lead" or "lag". While in S0, if the input signal "reset" is asserted, the DLL remains in the initial state of S0.

An input signal "lead" transitions the DLL from state S0 to state S1. The DLL receives a "lead" signal when a phase detector (106-0, 106-1, ..., 106-n) compares the clock (GCLK0, GCLK1, ..., GCLKn) to REF_CLK 110 and determines that the rising edge of the clock signal at the leaf node occurs before or "leads" the reference clock (REF_CLK). In state S1, the DLL increments its input clock signal (GCLK) by a fixed unit of delay. The DLL remains in S1 and increments the clock signal until the rising edge of GCLKn occurs after or "lags" the rising edge of REF_CLK. When this occurs, the FSM transitions to a locked state of S5. In state S5, the DLL does not respond to further "lead" or "lag" feedback.

However, while in state S0, an input signal "lag" transitions the DLL from state S0 to S2. The DLL receives a "lag" signal when the phase detector at a leaf node n compares the clock at the leaf node (GCLKn) to REF_CLK and determines that the rising edge of GCLKn occurs after or "lags" REF_CLK. In state S2, the DLL inverts its input clock signal (GCLK) and transitions to state S1. The DLL remains in state S1 and increments the inverted clock signal until the rising edge of GCLKn occurs after or "lags" the rising edge of REF_CLK. When this occurs, the FSM transitions to a locked state of S5. In state S5, the DLL does not respond to further "lead" or "lag" feedback.

Figure 3A:
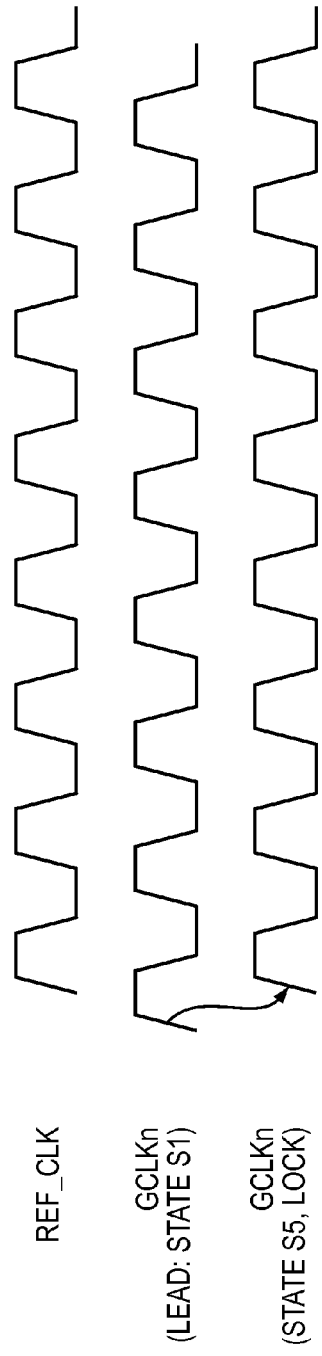
FIG. 3A is a diagram showing example waveforms for the locking sequence of the large range DLL.
Figure 3B:
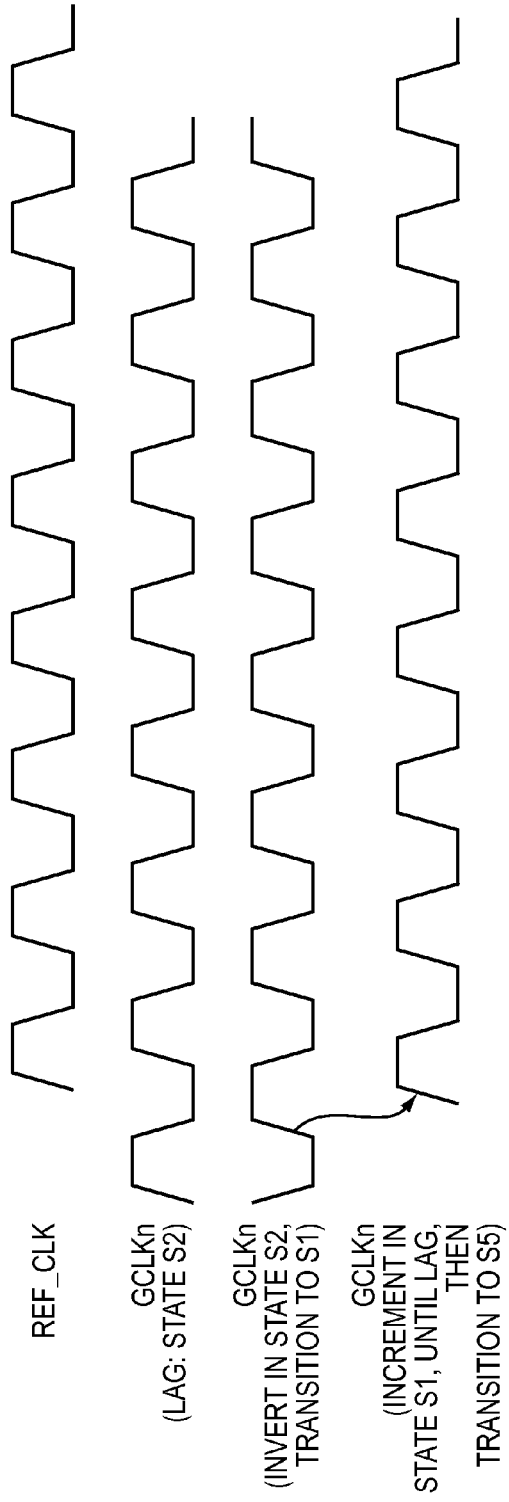
FIG. 3B is a diagram showing example waveforms for another locking sequence of the large range DLL.

The waveforms shown in FIG. 3A and FIG. 3B provide a detailed illustration of GCLKn as the FSM transitions through different sequence of states. FIG. 3A shows REF_CLK and GCLKn as the FSM transitions through the S1→S1→S5 sequence of states. FIG. 3B shows REF_CLK and GCLKn as the FSM transitions through the S0→S2→S1→S5 sequence of states.

A larger range DLL is capable of handling a larger range of mismatch between the clock at a leaf node and the reference clock than a smaller range DLL. However, an implementation of a larger range DLL occupies more physical area and consumes more power than a smaller range DLL. When all the tree branches in the clock distribution network have nominally matched insertion delays, any delay mismatches between the clocks at each leaf node (GCLKn) will be due to PVT variations. In this case, the typical clock distribution implementation with larger range DLLs will be inefficient in area usage and power consumption.

Figure 4:
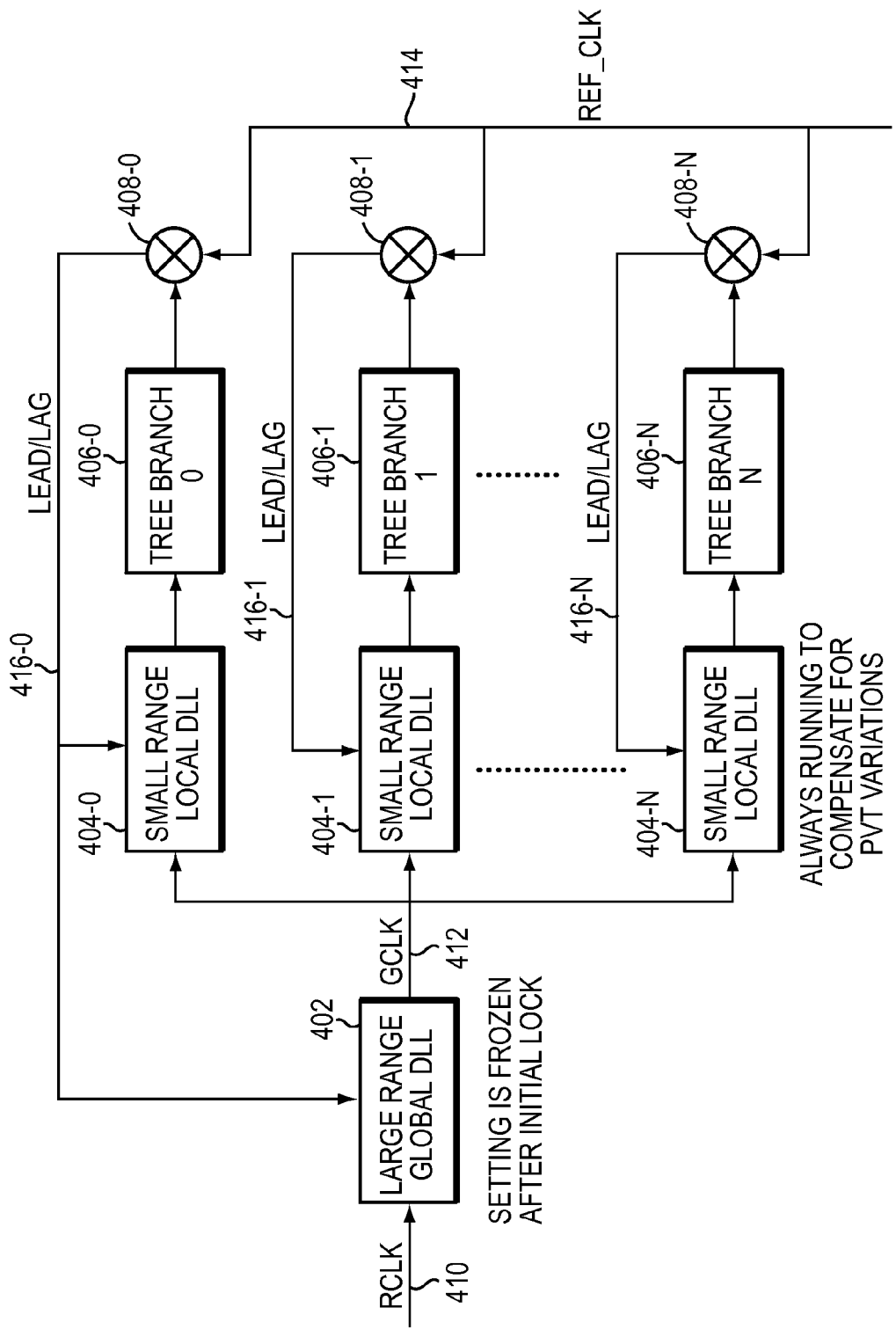
FIG. 4 is a block diagram showing an example clock distribution and alignment arrangement using large and small range DLLs in accordance with the present invention.

Embodiments of the present invention provide for clock distribution that is more area and power efficient than the typical approach of inserting large range DLLs on each branch of the clock distribution network. FIG. 4 is a block diagram of a clock distribution arrangement 400 in an example embodiment of the present invention in which a large range global DLL 402 is inserted at the root of the system clock (RCLK) 410. The clock generated by the global DLL (GCLK) 412 is distributed across multiple branches (406-0, 406-1, . . . , 406-n). A small range DLL (404-0, 404-1, . . . , 404-n) is inserted into each branch of the clock (GCLK) distribution network. The clock signal generated at the leaf node of each branch (GCLK0 . . . GCLKn) is independently aligned to a reference clock (REF_CLK) 414 based on comparison by corresponding phase comparator (408-0, 408-1, . . . , 408-n).

The small range DLL on each clock branch needs to align the clock generated at a leaf node (GCLKn) with REF_CLK under worst case PVT variations. Since the delays on the clock branches are nominally matched, the mismatch between the clock at the leaf node and the reference clock is likely to be due to PVT variations. Small range DLLs are sufficient on the branches because delay mismatches between the leaf node clocks (GCLKn) that are caused by PVT variations are likely to be significantly smaller than one phase of the global clock (GCLK) generated by the global DLL.

The state machine for the global DLL 402 is similar to the FSM shown in FIG. 2. The global DLL initially aligns the clock at a leaf node (GCLK0) of branch 406-0 to the reference clock (REF_CLK) 414. Because the delay on each clock branch is nominally matched, the clock at any leaf node (GCLKn) can be compared with REF_CLK for this initial alignment. After the initial alignment of GCLK0 to REF_CLK, the global DLL enters a locked state S5 and no longer responds to further "lead" or "lag" feedback. However, the small range DLLs are always running to compensate for phase mismatches caused by PVT variations.

Figure 5:
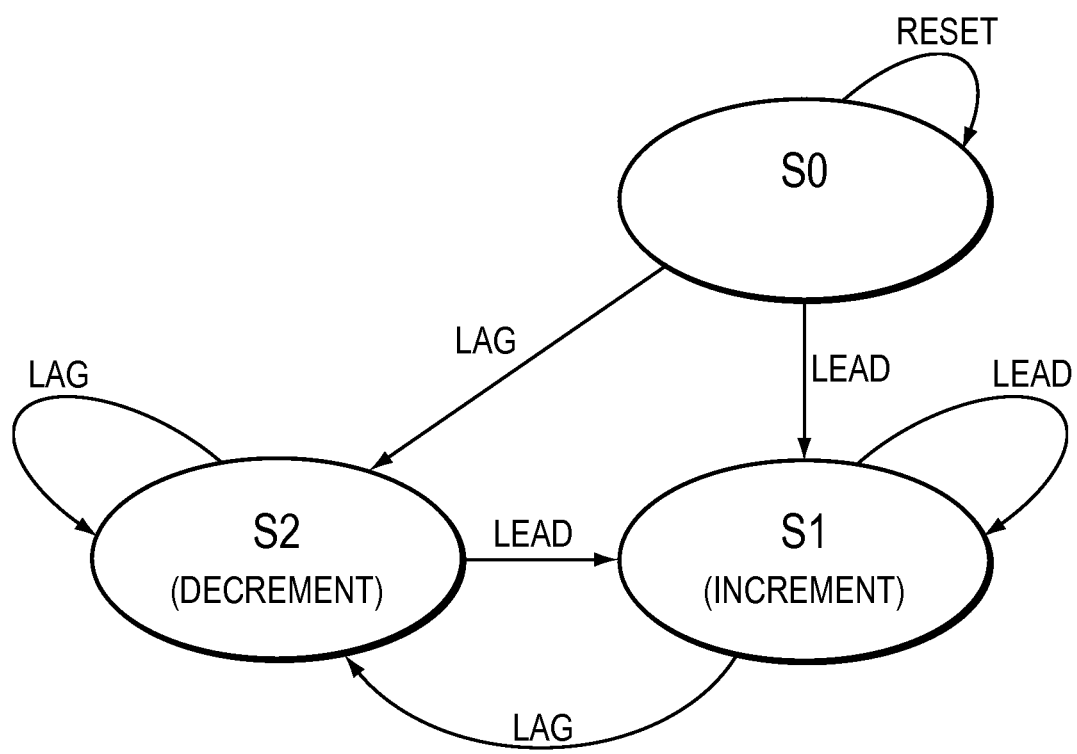
FIG. 5 is a diagram showing a finite state machine for the small range DLL of FIG. 4.

FIG. 5 shows the state machine of a local small range DLL (404-0, 404-1, . . . , 404-n) of the present invention. The local DLL is initialized to state S0. While in S0, the local DLL can transition states based on input signals "reset", "lead" or "lag". While in S0, if the input signal "reset" is asserted, the local DLL remains in the initial state of S0.

An input signal (416-0, 416-1, . . . , 416-n) "lead" transitions the local DLL from state S0 to state S1. The local DLL receives a "lead" signal feedback when a phase detector (408-0, 408-1, . . . , 408-n) compares the clock at the leaf node (GCLKn) to REF_CLK and determines that the rising edge of the clock signal at the leaf node (GCLKn) occurs before or "leads" the reference clock (REF_CLK). In state S1, the DLL increments its input clock signal (GCLK) by a fixed unit of delay. The DLL remains in S1 and increments the clock signal until the rising edge of GCLKn occurs after or "lags" the rising edge of REF_CLK. This transitions the DLL to state S2.

As shown in FIG. 5, an input signal "lag" transitions the local DLL from state S0 to S2. The local DLL receives a "lag" signal when the phase detector at a leaf node n compares the clock signal at the leaf node (GCLKn) to REF_CLK and determines that the rising edge of GCLKn occurs after or "lags" REF_CLK. In state S2, the local DLL decrements its input clock signal (GCLK) by a fixed unit of delay. The local DLL remains in state S2 and decrements the clock signal until the rising edge of GCLKn occurs before or "leads" the rising edge of REF_CLK. This transitions the DLL back to state S1.

Unlike the global large range DLL, the local small range DLL does not enter a locked state because the local DLLs are configured to continuously compensate for any phase mismatches at the leaf nodes (GCLKn) caused by PVT variations.

While this invention has been particularly shown and described with references to example embodiments thereof, it will be understood by those skilled in the art that various changes in form and details may be made therein without departing from the scope of the invention encompassed by the appended claims.

What is claimed is:

1. A clock distribution circuit comprising:
   a global delay locked loop (DLL) configured to receive a global clock input signal, a lead/lag input signal and to output a clock signal;
   a plurality of clock distribution blocks, each clock distribution block configured to receive the output of the global DLL, a lead/lag input signal and to output a leaf node clock signal, wherein each clock distribution block further comprises a local DLL;
   wherein the global DLL is further configured to align one of the plurality of leaf node clock signals, output by one of the plurality of clock distribution blocks, to a reference clock, the lead/lag input signal of the global DLL connected to the lead/lag input signal of the one of the plurality of clock distribution blocks;
   wherein each clock distribution block is further configured to align its leaf node clock signal to the reference clock based on its lead/lag input signal.

2. The clock distribution circuit of claim 1, wherein an initial phase mismatch between any two leaf node clock signals is less than a phase of the global clock input signal.

3. The clock distribution circuit of claim 1, wherein the global DLL is locked once it aligns one of the plurality of leaf node clock signals to the reference clock and no longer responds to its lead/lag input signal.

4. The clock distribution circuit of claim 1, wherein the reference clock frequency is equal to or an integer sub-multiple of the global clock frequency.

5. The clock distribution circuit of claim 1, wherein each local DLL further comprises a state machine configured to align an input clock signal to the reference clock based on at least its lead/lag input signal.

6. The clock distribution circuit of claim 5, wherein the state machine of the local DLL is configured to transition from an initial state to a selected state based on at least its lead/lag input signal.

7. The clock distribution circuit of claim 1, wherein the global DLL further comprises a state machine configured to align an input clock signal to the reference clock based on at least its lead/lag input signal.

8. The clock distribution circuit of claim 7, wherein the state machine is configured to transition to a state based on at least its lead/lag input signal.

* * * * *